(12) United States Patent
Yasusaka

(10) Patent No.: US 10,491,110 B2
(45) Date of Patent: Nov. 26, 2019

(54) SWITCHING CONTROL CIRCUIT

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/019,616

(22) Filed: Jun. 27, 2018

(65) Prior Publication Data
US 2019/0006942 A1 Jan. 3, 2019

(30) Foreign Application Priority Data

Jun. 30, 2017 (JP) ................... 2017-128551

(51) Int. Cl.
*H02M 1/44* (2007.01)
*H02M 1/00* (2006.01)
*H02M 1/14* (2006.01)
*H02M 1/088* (2006.01)
*H02M 1/42* (2007.01)
*H03K 17/16* (2006.01)
*H02M 3/156* (2006.01)
*H03K 17/693* (2006.01)
*H02M 3/137* (2006.01)

(52) U.S. Cl.
CPC ........... *H02M 1/44* (2013.01); *H02M 1/4225* (2013.01); *H02M 3/137* (2013.01); *H02M 3/156* (2013.01); *H03K 17/161* (2013.01); *H03K 17/163* (2013.01); *H03K 17/693* (2013.01)

(58) Field of Classification Search
CPC ........ H02M 1/44; H02M 1/08; H02M 1/4225; H02M 3/156; H02M 1/143; H02M 1/0088; H03K 17/161; H03K 17/693
See application file for complete search history.

(56) References Cited

U.S. PATENT DOCUMENTS

| | | | | |
|---|---|---|---|---|
| 7,362,147 B2 * | 4/2008 | Rebholz-Goldmann | ..................... | H03K 17/164 327/108 |
| 8,508,259 B2 * | 8/2013 | Joos | ...................... | H03K 17/166 326/83 |
| 8,981,820 B2 * | 3/2015 | Bodano | ................. | H03K 17/165 327/109 |
| 9,024,558 B2 * | 5/2015 | Sugie | ...................... | H03K 3/012 318/400.26 |
| 9,397,658 B2 * | 7/2016 | Sicard | ................... | H03K 17/687 |
| 9,590,609 B1 * | 3/2017 | Musa | ................... | H03K 17/162 |

(Continued)

FOREIGN PATENT DOCUMENTS

JP    2006-129593    5/2006

*Primary Examiner* — Yusef A Ahmed
*Assistant Examiner* — Sisay G Tiku
(74) *Attorney, Agent, or Firm* — Fish & Richardson P.C.

(57) ABSTRACT

A switching control circuit includes a first current source, a second current source, a first switch disposed between the first current source and a gate of a switching element, and a second switch disposed between the second current source and the gate of the switching element. The first switch and the second switch are complementarily turned on and off according to a pulse signal. At least one of a value of current supplied to the gate of the switching element from the first current source when the first switch is turned on, and a value of current that flows out from the gate of the switching element to the second current source when the second switch is turned on, is changed periodically.

29 Claims, 8 Drawing Sheets

(56) References Cited

U.S. PATENT DOCUMENTS

| | | | | |
|---|---|---|---|---|
| 10,003,330 B2* | 6/2018 | Sicard | ............... | H03K 17/0412 |
| 2006/0285260 A1* | 12/2006 | Kamenicky | ...... | H03K 17/04123 |
| | | | | 361/2 |
| 2007/0040542 A1* | 2/2007 | Cortigiani | .......... | H03K 17/0822 |
| | | | | 323/312 |
| 2007/0103133 A1* | 5/2007 | Joos | ..................... | H03K 17/166 |
| | | | | 323/282 |
| 2009/0002054 A1* | 1/2009 | Tsunoda | ............. | H03K 17/0406 |
| | | | | 327/374 |
| 2012/0126859 A1* | 5/2012 | Kawamoto | .......... | H03K 17/163 |
| | | | | 327/108 |
| 2013/0009671 A1* | 1/2013 | Suzuki | ................ | H03K 17/164 |
| | | | | 327/108 |
| 2013/0214823 A1* | 8/2013 | Kawamoto | ............ | H02H 9/025 |
| | | | | 327/109 |
| 2013/0229166 A1* | 9/2013 | Tetelbaum | ............... | H03K 4/94 |
| | | | | 323/312 |
| 2013/0285732 A1* | 10/2013 | Mori | ................... | H03K 17/145 |
| | | | | 327/378 |
| 2016/0380527 A1* | 12/2016 | Hayakawa | ........ | H02M 3/33507 |
| | | | | 363/21.12 |
| 2018/0123440 A1* | 5/2018 | Lee | ......................... | H02M 1/08 |

* cited by examiner

SWITCHING CONTROL CIRCUIT

CROSS-REFERENCE TO RELATED APPLICATIONS

This nonprovisional application claims priority under 35 U.S.C. § 119(a) on Patent Application No. 2017-128551 filed in Japan on Jun. 30, 2017, the entire contents of which are hereby incorporated by reference.

BACKGROUND OF THE INVENTION

Field of the Invention

The present invention relates to a switching control circuit that controls on/off of a switching element.

Description of Related Art

In recent years, computerization of in-vehicle devices has been advanced, and demands for communication integrated circuits (ICs) are increased. However, a communication IC can be a noise source, and hence it is necessary to enforce countermeasures against noise in order to improve reliability of the in-vehicle devices.

In addition, also in electronic devices such as a personal computer and a portable device, integration and downsizing of circuits are promoted, and enforcement of countermeasures against noise has been demanded.

A switching regulator disclosed in FIG. 3 of JP-A-2006-129593 decreases the slew rate of a control signal that drives a switching element when a device susceptible to noise is turned on, so that noise generated from the switching regulator is reduced.

However, in the switching regulator disclosed in FIG. 3 of JP-A-2006-129593, when the device susceptible to noise is turned on, the control signal that drives the switching element has a fixed slew rate, and hence frequency of EMI noise due to the slew rate is concentrated on a specific frequency. In this way, a peak value of the EMI noise at the specific frequency is increased.

SUMMARY OF THE INVENTION

It is an object of the present invention to provide a switching control circuit capable of reducing a peak value of EMI noise generated when a switching element is driven.

A switching control circuit disclosed in this specification includes a first current source, a second current source, a first switch disposed between the first current source and a gate of a switching element, and a second switch disposed between the second current source and the gate of the switching element. The first switch and the second switch are complementarily turned on and off according to a pulse signal. At least one of a value of current supplied to the gate of the switching element from the first current source when the first switch is turned on, and a value of current that flows out from the gate of the switching element to the second current source when the second switch is turned on, is changed periodically.

A communication device disclosed in this specification includes the switching control circuit having the structure described above, and the switching element.

A switching power supply device disclosed in this specification includes the switching control circuit having the structure described above, and the switching element.

A vehicle disclosed in this specification includes at least one of the communication device having the structure described above and the switching power supply device having the structure described above.

An electronic device disclosed in this specification includes at least one of the communication device having the structure described above and the switching power supply device having the structure described above.

Meanings and effects of the present invention will be further clear from the description of the following embodiments. However, the following embodiments are merely examples of the present invention, and the present invention and meanings of terms of structural elements are not limited to those described in the following embodiments.

DETAILED DESCRIPTION OF THE PREFERRED EMBODIMENTS

<First Embodiment>

Figure 1:
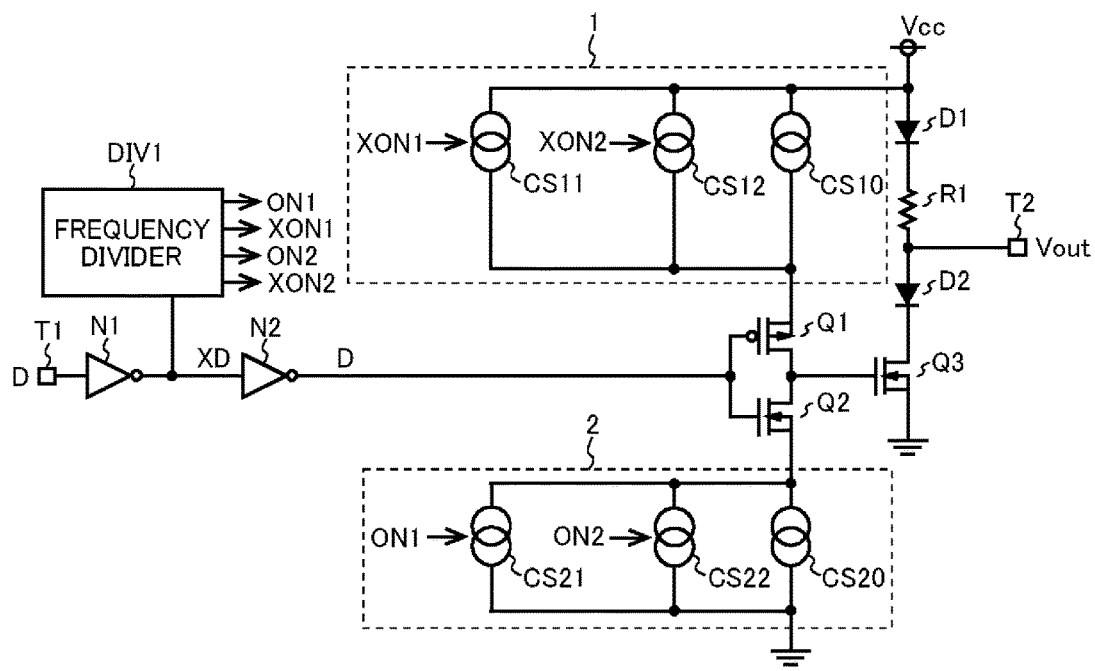
FIG. 1 is a diagram schematically illustrating a switching control circuit according to a first embodiment.

FIG. 1 is a diagram schematically illustrating a switching control circuit according to a first embodiment. The switching control circuit according to this embodiment includes inverters N1 and N2, a frequency divider DIV1, constant current sources 1 and 2, and switches Q1 and Q2. The current source 1 is a parallel circuit of constant current sources CS10 to CS12, and the current source 2 is a parallel circuit of constant current sources CS20 to CS22. The switching control circuit according to this embodiment drives a switching element Q3 so as to control on/off of the switching element Q3. In this embodiment, a P-channel metal oxide semiconductor (MOS) field-effect transistor is used as the switch Q1, an N-channel MOS field-effect transistor is used as the switch Q2, and an N-channel MOS field-effect transistor is used as the switching element Q3.

A terminal T1 is connected to an input terminal of the inverter N1. An output terminal of the inverter N1 is connected to the frequency divider DIV1 and an input terminal of the inverter N2. An output terminal of the inverter N2 is connected to the gates of the switches Q1 and Q2.

The source of the switch Q1 is connected to a low potential terminal of the current source 1. A high potential terminal of the current source 1 is applied with a constant voltage Vcc. The drains of the switches Q1 and Q2 are connected to the gate of the switching element Q3. The source of the switch Q2 is connected to a high potential terminal of the current source 2. A low potential terminal of the current source 2 is connected to an application terminal of a ground potential.

A circuit constituted of diodes D1 and D2, a resistor R1, and the switching element Q3 generates an output voltage Vout. The anode of the diode D1 is applied with the constant voltage Vcc. The cathode of the diode D1 is connected to the anode of the diode D2 via the resistor R1. The cathode of the diode D1 is connected to the drain of the switching element Q3. The source of the switching element Q3 is connected to an application terminal of the ground potential. A connection node between the resistor R1 and the diode D2 is connected to a terminal T2.

In the switching control circuit having the structure described above according to this embodiment, the terminal T1 is supplied with a pulse signal D. The inverter N1 supplies an inverted signal XD of the pulse signal D to the frequency divider DIV1 and the inverter N2.

The frequency divider DIV1 generates a frequency-divided signal of the pulse signal D based on the inverted signal XD of the pulse signal D. In this embodiment, the frequency divider DIV1 generates four frequency-divided signals ON1, XON1, ON2, and XON2. The frequency-divided signal ON1 is supplied to the constant current source CS21. The frequency-divided signal XON1 is supplied to the constant current source CS11. The frequency-divided signal ON2 is supplied to the constant current source CS22. The frequency-divided signal XON2 is supplied to the constant current source CS12. Note that unlike this embodiment, the frequency divider DIV1 may generate the frequency-divided signal of the pulse signal D based on the pulse signal D, and the frequency divider DIV1 may generate the frequency-divided signal of the pulse signal D based on the pulse signal D and the inverted signal XD of the pulse signal D.

The inverter N2 supplies the pulse signal D to the gates of the switches Q1 and Q2. In this way, the switches Q1 and Q2 are complementarily turned on and off according to the pulse signal D. Note that on and off of the switches Q1 and Q2 are completely reversed in this embodiment, but a simultaneous off period (dead time) may be provided. In other words, the term "complementarily" used in this specification includes not only the case where on and off of the switches Q1 and Q2 are completely reversed but also the case where the simultaneous off period (dead time) is provided.

When the switch Q1 is turned on, the current source 1 supplies current to the gate of the switching element Q3. The constant current source CS11 in the current source 1 is enabled when the frequency-divided signal XON1 is at high level and is disabled when the frequency-divided signal XON1 is at low level. In addition, the constant current source CS12 in the current source 1 is enabled when the frequency-divided signal XON2 is at high level and is disabled when the frequency-divided signal XON2 is at low level. Therefore the current source 1 is controlled based on the frequency-divided signals XON1 and XON2, and the value of current, which is supplied to the gate of the switching element Q3 from the current source 1 when the switch Q1 is turned on, changes periodically.

On the other hand, when the switch Q2 is turned on, current flows out from the gate of the switching element Q3 to the current source 2. The constant current source CS21 in the current source 2 is enabled when the frequency-divided signal ON1 is at high level and is disabled when the frequency-divided signal ON1 is at low level. In addition, the constant current source CS22 in the current source 2 is enabled when the frequency-divided signal ON2 is at high level and is disabled when the frequency-divided signal ON2 is at low level. Therefore the current source 2 is controlled based on the frequency-divided signals ON1 and ON2, and the value of current, which flows out from the gate of the switching element Q3 to the current source 2 when the switch Q2 is turned on, changes periodically.

An output voltage Vo, which is generated according to on/off of the switching element Q3 and is output from the terminal T2, becomes low level (substantially the same level as the ground potential) when the switching element Q3 is turned on, and becomes high level (substantially the same level as the constant voltage Vcc) when the switching element Q3 is turned off.

Figure 2:
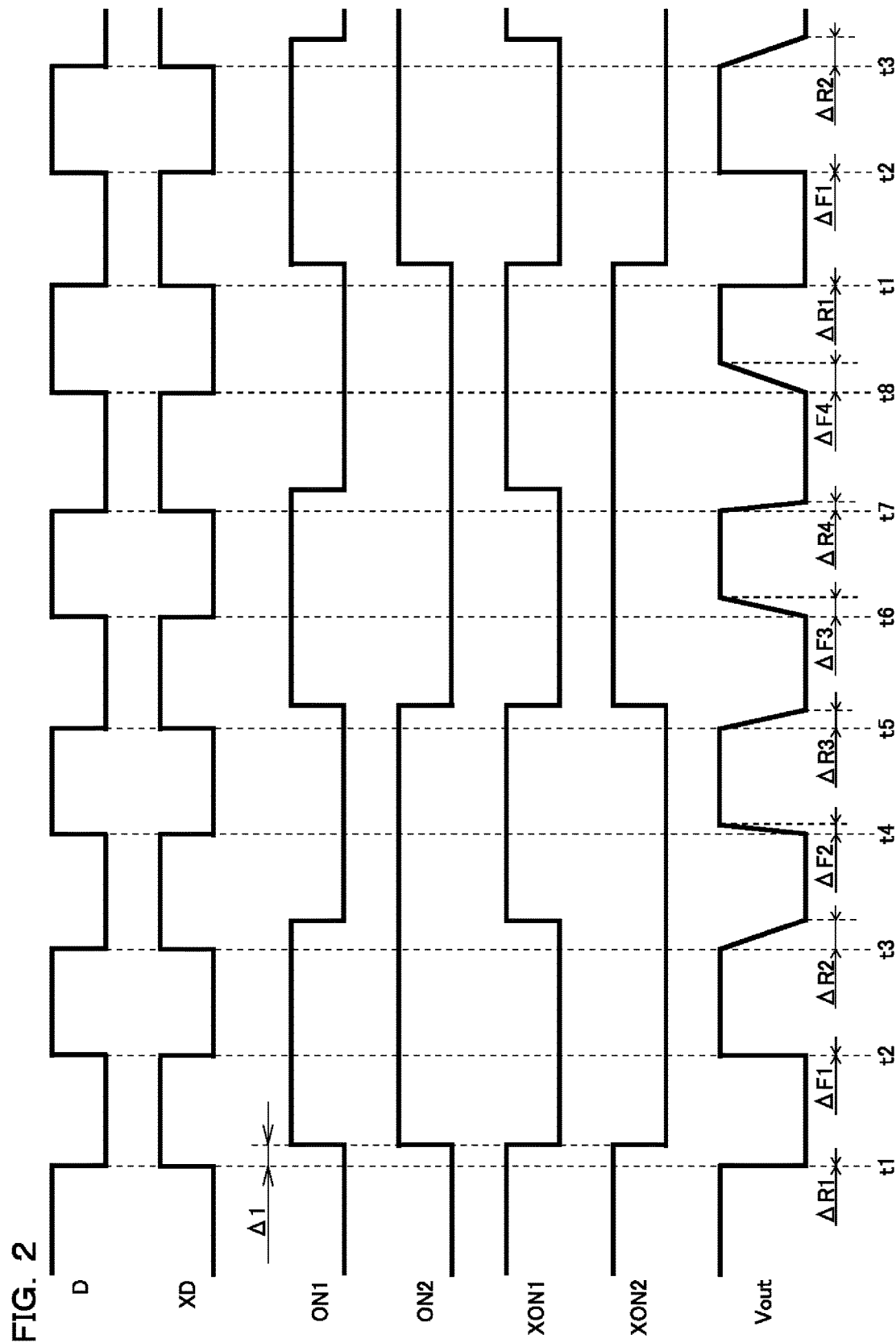
FIG. 2 is a time chart showing voltage waveforms of individual portions of the switching control circuit according to the first embodiment.

FIG. 2 is a timing chart showing voltage waveforms of individual portions of the switching control circuit according to this embodiment. The frequency-divided signal ON1 is a ½ frequency-divided signal of the pulse signal D, and the frequency-divided signal ON2 is a ¼ frequency-divided signal of the pulse signal D. The frequency-divided signal XON1 is an inverted signal of the frequency-divided signal ON1, and the frequency-divided signal XON2 is an inverted signal of the frequency-divided signal ON2. The inversion timing of the frequency-divided signals ON1, XON1, ON2, and XON2 is delayed from the inversion timing of the pulse signal D by time Δ1. In other words, delay time of the frequency-divided signal ON1, XON1, ON2, and XON2 from the pulse signal D is time Δ1.

An example is described below in which a constant current $I_{P0}$ output from the constant current source CS10, a constant current $I_{P1}$ output from the constant current source CS11, and a constant current $I_{P2}$ output from the constant current source CS12 satisfy "$I_{P0}:I_{P1}:I_{P2}=1:0.5:1$", and a constant current $I_{N0}$ output from the constant current source CS20, a constant current $I_{N1}$ output from the constant current source CS21, and a constant current $I_{N2}$ output from the constant current source CS12 satisfy "$I_{N0}:I_{N1}:I_{N2}=1:0.5:1$".

The current supplied to the gate of the switching element Q3 at time t1 is $2.5 \times I_{P0}$ ($=I_{P0}+I_{P1}+I_{P2}$). The current supplied to the gate of the switching element Q3 at time t3 is $I_{P0}$. The current supplied to the gate of the switching element Q3 at time t5 is $1.5 \times I_{P0}$ ($=I_{P0}+I_{P1}$). The current supplied to the gate of the switching element Q3 at time t7 is $2 \times I_{P0}$ ($=I_{P0}+I_{P2}$). After that, time t1, time t3, time t5, and time t7 are repeated. In other words, the current supplied to the gate of the switching element Q3 from the current source 1 changes from $2.5 \times I_{P0}$ to $I_{P0}$ to $1.5 \times I_{P0}$ to $2 \times I_{P0}$ to $2.5 \times I_{P0}$ and so on at each period of the pulse signal D.

Figure 3:
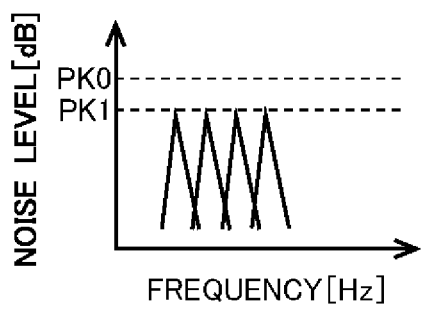
FIG. 3 is a diagram schematically illustrating EMI noise due to a rising slew rate of a gate signal supplied to a switching element in the switching control circuit according to the first embodiment.

The rising slew rate of the gate signal supplied to the switching element Q3 depends on drive capacity of the current source 1. Therefore the gate signal supplied to the switching element Q3 has four types of rising slew rates. In this way, the frequency of EMI noise due to the rising slew rate of the gate signal supplied to the switching element Q3 can be dispersed into four frequencies as illustrated in FIG. 3. This frequency dispersion can reduce peak value PK1 of the EMI noise. Note that in FIG. 3, peak value PK0 described later is also shown for reference.

Figure 4:
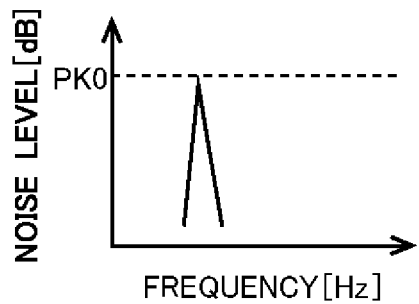
FIG. 4 is a diagram schematically illustrating EMI noise due to a rising slew rate of a control signal that drives a switching element in the switching regulator disclosed in FIG. 3 of JP-A-2006-129593.

On the other hand, as the switching regulator disclosed in FIG. 3 of JP-A-2006-129593, if the rising slew rate of the control signal that drives the switching element is fixed, the frequency of EMI noise due to the rising slew rate of the control signal that drives the switching element is fixed to one frequency as shown in FIG. 4. This causes an increase in the peak value PK0 of the EMI noise due to the fixed rising slew rate of the control signal that drives the switching element.

Also for the EMI noise due to a falling slew rate of the gate signal supplied to the switching element Q3, similarly to the EMI noise due to the rising slew rate of the gate signal supplied to the switching element Q3 described above, a peak value of the EMI noise can be reduced by frequency dispersion.

The current that flows out from the gate of the switching element Q3 at time t2 is $2.5 \times I_{N0}$ ($=I_{N0}+I_{N1}+I_{N2}$). The current that flows out from the gate of the switching element Q3 at time t4 is $2 \times I_{N0}$ ($=I_{N0}+I_{N2}$). The current that flows out from the gate of the switching element Q3 at time t6 is $1.5 \times I_{N0}$ ($=I_{N0}+I_{N1}$). The current that flows out from the gate of the switching element Q3 at time t8 is $I_{N0}$. After that, time t2, time t4, time t6, and time t8 are repeated. In other words, the current that flows out from the gate of the switching element Q3 to the current source 2 changes from $2.5 \times I_{N0}$ to $2 \times I_{N0}$ to $1.5 \times I_{N0}$ to $I_{N0}$ to $2.5 \times I_{N0}$ and so on at each period of the pulse signal D.

The falling slew rate of the gate signal supplied to the switching element Q3 depends on drive capacity of the current source 2. Therefore the gate signal supplied to the switching element Q3 has four types of falling slew rates. In this way, the frequency of EMI noise due to the falling slew rate of the gate signal supplied to the switching element Q3 can be dispersed into four frequencies. This frequency dispersion can reduce a peak value of the EMI noise.

On the other hand, as the switching regulator disclosed in FIG. 3 of JP-A-2006-129593, the falling slew rate of the control signal that drives the switching element is fixed, the frequency of EMI noise due to the falling slew rate of the control signal that drives the switching element is fixed to one frequency. Therefore, a peak value of the EMI noise due to the fixed falling slew rate of the control signal that drives the switching element is increased.

As described above, the switching control circuit according to this embodiment can reduce a peak value of the EMI noise generated when the switching element Q3 is driven. In this way, it is possible to reduce bad influence to surrounding devices by the EMI noise generated when the switching element Q3 is driven.

In addition, the switching control circuit according to this embodiment has a structure in which the current source 1, the switch Q1, the switch Q2, and the current source 2 are connected in series, and hence it is possible to prevent a through current from flowing only by preventing the switches Q1 and Q2 from being simultaneously turned on. In other words, it is easy to control so that a through current is prevented from flowing. In addition, if a through current flows accidentally, the current source 1 or the current source 2 restricts the through current, and hence the IC (including the switching control circuit according to this embodiment) is not broken down.

In contrast, the switching regulator disclosed in FIG. 3 of JP-A-2006-129593 has a structure in which two upper switches are connected in parallel and two lower switches are connected in parallel. Therefore, it is necessary to prevent at least one of the two upper switches and at least one of the two lower switches from being simultaneously turned on in order to prevent a through current from flowing. In other words, it is complicated to control so that a through current is prevented from flowing.

In addition, in the switching control circuit according to this embodiment, the value of the current supplied to the gate of the switching element Q3 from the current source 1 when the switch Q1 is turned on and the value of the current that flows out from the gate of the switching element Q3 to the current source 2 when the switch Q2 is turned on are each changed at each period of the pulse signal D. In this way, also in a temporal view, the frequency of EMI noise due to the rising slew rate of the gate signal supplied to the switching element Q3 and the frequency of EMI noise due to the falling slew rate of the gate signal supplied to the switching element Q3 are dispersed into frequencies (by period unit of the pulse signal D). Therefore, also in a temporal view, it is possible to prevent the EMI noise from concentrating on a specific frequency.

Note that if the value of the current supplied to the gate of the switching element Q3 from the current source 1 when the switch Q1 is turned on and the value of the current that flows out from the gate of the switching element Q3 to the current source 2 when the switch Q2 is turned on are each changed periodically, the peak value of the EMI noise due to the slew rate of the gate signal supplied to the switching element Q3 can be reduced. Therefore, unlike this embodiment, it is possible, for example, to adopt a structure in which the value of the current supplied to the gate of the switching element Q3 from the current source 1 when the switch Q1 is turned on and the value of the current that flows out from the gate of the switching element Q3 to the current source 2 when the switch Q2 is turned on are each changed every predetermined period longer than the period of the pulse signal D. In other words, the same effect as this embodiment can be obtained by changing the slew rate every arbitrary number of pulses of the pulse signal D instead of changing the slew rate every pulse of the pulse signal D.

In addition, the rising slew rate of the gate signal supplied to the switching element Q3 and the falling slew rate of the gate signal supplied to the switching element Q3 have each four types in this embodiment, but a plurality of types are sufficient without limiting to four types. For example, by using more number of constant current sources and more frequency division patterns than this embodiment, the rising slew rate of the gate signal supplied to the switching element Q3 and the falling slew rate of the gate signal supplied to the switching element Q3 can each have 8 types or 16 types in a structure similar to this embodiment.

In addition, it is possible to add setting (e.g. setting of $1.75 \times I_{P0}$) that does not correspond to any of the four types of slew rates used in this embodiment to the current supplied to the gate of the switching element Q3 from the current source 1, so that the four types of slew rates used in this embodiment appear intermittently with the slew rate corresponding to $1.75 \times I_{P0}$ intervened. In other words, the current supplied to the gate of the switching element Q3 from the current source 1 may be changed from $2.5 \times I_{P0}$ to $1.75 \times I_{P0}$ to $I_{P0}$ to $1.75 \times I_{P0}$ to $1.5 \times I_{P0}$ to $1.75 \times I_{P0}$ to $2 \times I_{P0}$ to $1.75 \times I_{P0}$ to $2.5 \times I_{P0}$ and so on at each arbitrary period.

In addition, it is possible to add setting (e.g. setting of $1.75 \times I_{P0}$) that does not correspond to any of the four types of slew rates used in this embodiment to the current supplied to the gate of the switching element Q3 from the current source 1, so that the four types of slew rates used in this embodiment appear successively and after that the slew rate corresponding to $1.75 \times I_{P0}$ appear four times successively. In other words, the current supplied to the gate of the switching element Q3 from the current source 1 may be changed from $2.5 \times I_{P0}$ to $I_{P0}$ to $1.5 \times I_{P0}$ to $2 \times I_{P0}$ to $1.75 \times I_{P0}$ to $1.75 \times I_{P0}$ to $1.75 \times I_{P0}$ to $1.75 \times I_{P0}$ to $2.5 \times I_{P0}$ and so on at each arbitrary period.

In addition, it is possible to add setting (e.g. setting of $1.75 \times I_{N0}$) that does not correspond to any of the four types of slew rates used in this embodiment to the current that flows out from the gate of the switching element Q3 to the current source 2, so that the four types of slew rates used in this embodiment appear intermittently with the slew rate corresponding to $1.75 \times I_{N0}$ intervened. In other words, the current that flows out from the gate of the switching element Q3 to the current source 2 may be changed from $2.5 \times I_{N0}$ to $1.75 \times I_{N0}$ to $2 \times I_{N0}$ to $1.75 \times I_{N0}$ to $1.5 \times I_{N0}$ to $1.75 \times I_{N0}$ to $I_{N0}$ to $1.75 \times I_{N0}$ to $2.5 \times I_{N0}$ and so on at each arbitrary period.

In addition, it is possible to add setting (e.g. setting of $1.75 \times I_{N0}$) that does not correspond to any of the four types of slew rates used in this embodiment to the current that flows out from the gate of the switching element Q3 to the current source 2, so that the four types of slew rates used in this embodiment appear successively and after that the slew rate corresponding to $1.75 \times I_{N0}$ appear four times successively. In other words, the current that flows out from the gate of the switching element Q3 to the current source 2 may be changed from $2.5 \times I_{N0}$ to $2 \times I_{N0}$ to $1.5 \times I_{N0}$ to $I_{N0}$ to $1.75 \times I_{N0}$ to $1.75 \times I_{N0}$ to $1.75 \times I_{N0}$ to $1.75 \times I_{N0}$ to $2.5 \times I_{N0}$ and so on at each arbitrary period.

In addition, in the switching control circuit according to this embodiment, at both edges of each pulse of the output voltage Vout generated corresponding to on/off of the switching element Q3, as a value of the current supplied to the gate of the switching element Q3 at one edge is larger, a value of the current that flows out from the gate of the switching element Q3 at the other edge is smaller. In this way, as to each pulse of the output voltage Vout, it is possible to reduce a fluctuation of the sum of the rising slew rate and the falling slew rate of the gate signal supplied to the gate of the switching element Q3. Therefore it is possible to prevent on-duty of the output voltage Vout from being affected to fluctuate by the slew rate of the gate signal supplied to the gate of the switching element Q3.

For example, if $I_{P0}=I_{N0}$ holds in the setting example of the constant currents output respectively from the constant current sources CS10 to CS12 and CS20 to CS22 described above, at both edges of each pulse of the output voltage Vout generated corresponding to on/off of the switching element Q3, the sum of the value of the current supplied to the gate of the switching element Q3 at one edge and the value of the current that flows out from the gate of the switching element Q3 at the other edge becomes substantially constant ($=3.5 \times I_{P0}$), and it is possible to more effectively prevent on-duty of the output voltage Vout from being affected to fluctuate by the slew rate of the gate signal supplied to the gate of the switching element Q3. In other words, at both edges of each pulse of the output voltage Vout generated corresponding to on/off of the switching element Q3, the sum of rising slew rate time ΔR at one edge (rising slew rate time ΔR of the gate signal supplied to the gate of the switching element Q3) and falling slew rate time ΔF at the other edge (falling slew rate time ΔF of the gate signal supplied to the gate of the switching element Q3) becomes substantially constant, and hence it is possible to more effectively prevent on-duty of the output voltage Vout from being affected to fluctuate by the slew rate of the gate signal supplied to the gate of the switching element Q3.

In addition, for example, if $I_{P0}=I_{N0}$ holds in the setting example of the constant currents output respectively from the constant current sources CS10 to CS12 and CS20 to CS22 described above, at both edges of each pulse of the output voltage Vout generated corresponding to on/off of the switching element Q3, the value of the current supplied to the gate of the switching element Q3 at one edge and the value of the current that flows out from the gate of the switching element Q3 at the other edge are different from each other. In other words, at both edges of each pulse of the output voltage Vout generated corresponding to on/off of the switching element Q3, the rising slew rate time ΔR at one edge and the falling slew rate time ΔF at the other edge are different from each other.

In addition, in this embodiment, in one period of fluctuation of the current supplied to the gate of the switching element Q3 from the current source 1, there are only periods having different current values (a first period having a current value of $2.5 \times I_{P0}$, a second period having a current value of $I_{P0}$, a third period having a current value of $1.5 \times I_{P0}$, and a fourth period having a current value of $2 \times I_{P0}$), and a plurality of periods having the same current value do not exist separately. In other words, in one period of fluctuation of the rising slew rate time, there are only periods having different times (the first period having a rising slew rate time of ΔR1, the second period having a rising slew rate time of ΔR2, the third period having a rising slew rate time of ΔR3, and the fourth period having a rising slew rate time of ΔR4) and a plurality of periods having the same rising slew rate time do not exist separately.

In addition, in this embodiment, in one period of fluctuation of the current that flows out from the gate of the switching element Q3 to the current source 2, there are only periods having different current values (a fifth period having a current value of $2.5 \times I_{N0}$, a sixth period having a current value of $2 \times I_{N0}$, a seventh period having a current value of $1.5 \times I_{N0}$, and an eighth period having a current value of $I_{N0}$), and a plurality of periods having the same current value do not exist separately. In other words, in one period of fluctuation of the falling slew rate time, there are only periods having different times (the fifth period having a falling slew rate time of ΔF1, the sixth period having a falling slew rate time of ΔF2, a seventh period having a falling slew rate time of ΔF3, and the eighth period having a rising slew rate time of ΔF4), and a plurality of periods having the same falling slew rate time do not exist separately.

In addition, in this embodiment, the delay time Δ1 of the frequency-divided signal ON1, XON1, ON2, and XON2 from the pulse signal D is equal to or larger than the maximum value of pulse rising time of the output voltage Vout generated according to on/off of the switching element Q3, and is equal to or larger than the maximum value of pulse falling time of the output voltage Vout generated according to on/off of the switching element Q3. In this way, the slew rate of the gate signal supplied to the gate of the switching element Q3 is not changed at a midpoint during pulse rising or pulse falling of the output voltage Vout. Therefore it is easy to determine characteristics of the EMI noise due to the slew rate of the gate signal supplied to the switching element Q3 and the influence given to the on-duty of the output voltage Vout by the slew rate of the gate signal supplied to the gate of the switching element Q3. Note that the pulse rising time of the output voltage Vout is time necessary for the output voltage Vout to change from low level until reaching high level, and the pulse falling time of the output voltage Vout is time necessary for the output voltage Vout to change from high level until reaching low level.

<Second Embodiment>

Figure 5:
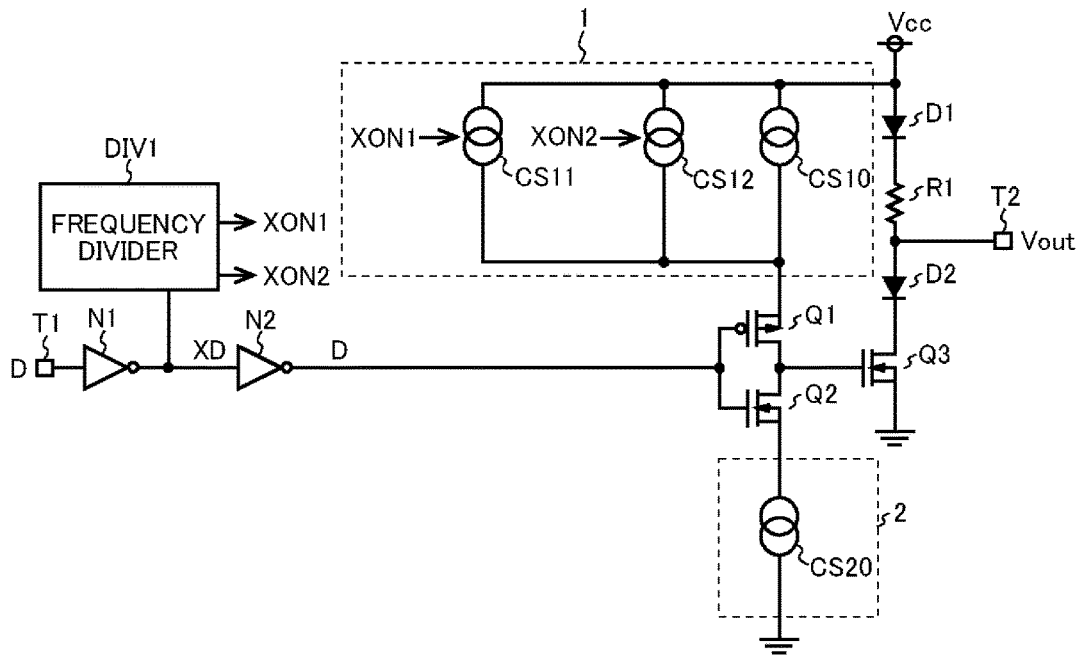
FIG. 5 is a diagram schematically illustrating a switching control circuit according to a second embodiment.

FIG. 5 is a diagram schematically illustrating a switching control circuit according to a second embodiment. The switching control circuit according to this embodiment is different from the switching control circuit according to the first embodiment in that the current source 2 is constituted of only the constant current source CS20. The switching control circuit according to this embodiment can reduce a peak value of EMI noise generated when the switching element Q3 is switched from off to on. In this way, it is possible to reduce bad influence to surrounding devices by the EMI noise generated when the switching element Q3 is driven.

<Third Embodiment>

Figure 6:
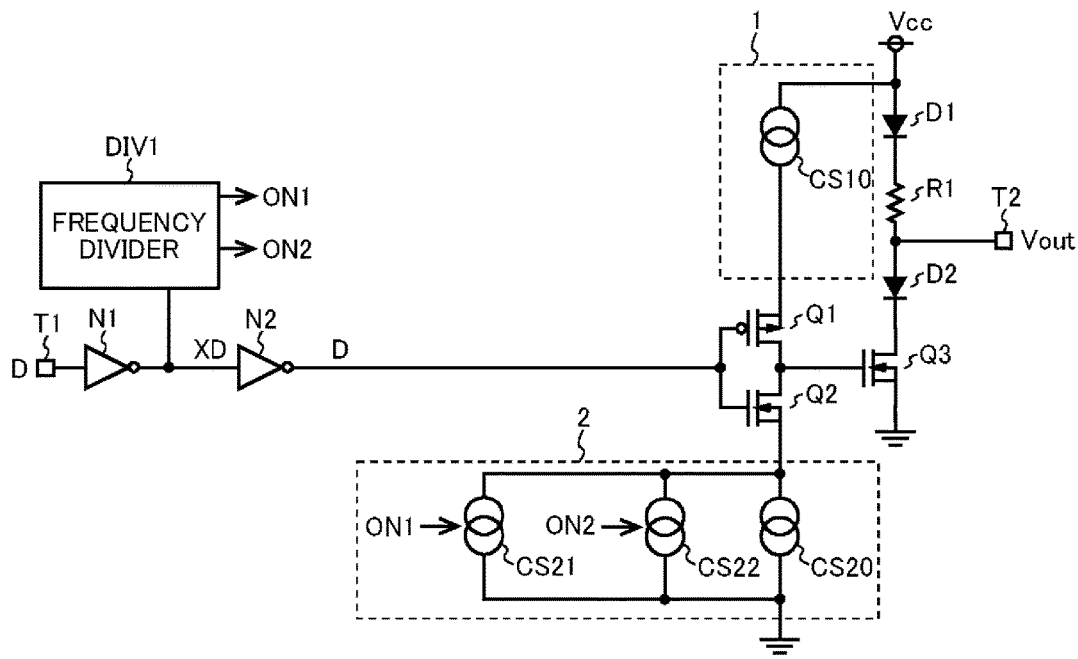
FIG. 6 is a diagram schematically illustrating a switching control circuit according to a third embodiment.

FIG. 6 is a diagram schematically illustrating a switching control circuit according to a third embodiment. The switching control circuit according to this embodiment is different from the switching control circuit according to the first embodiment in that the current source 1 is constituted of only the constant current source CS10. The switching control circuit according to this embodiment can reduce a peak value of EMI noise generated when the switching element Q3 is switched from on to off. In this way, it is possible to reduce bad influence to surrounding devices by the EMI noise generated when the switching element Q3 is driven.

<Fourth Embodiment>

Figure 7A:
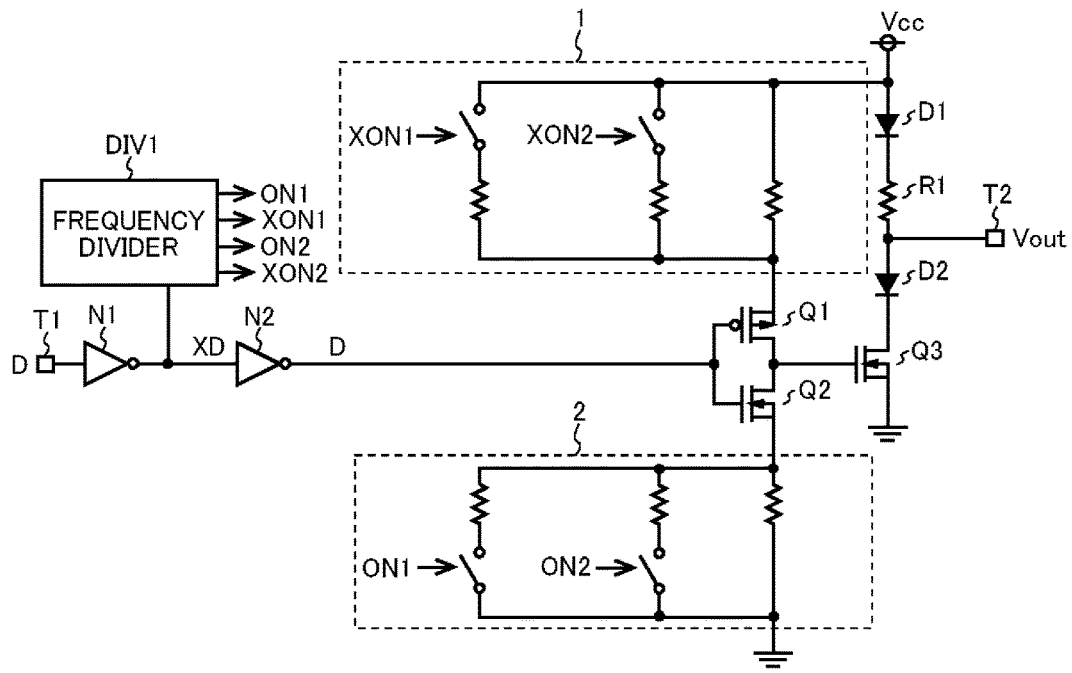
FIG. 7A is a diagram schematically illustrating a switching control circuit according to a fourth embodiment.
Figure 7B:
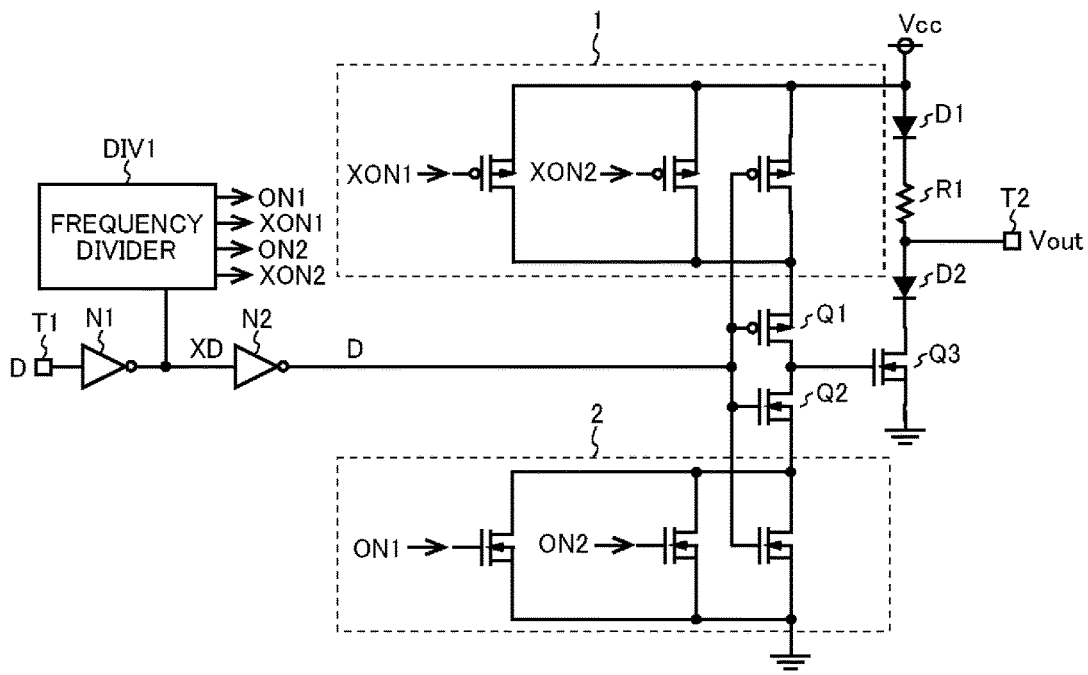
FIG. 7B is a diagram schematically illustrating another switching control circuit according to the fourth embodiment.
Figure 7C:
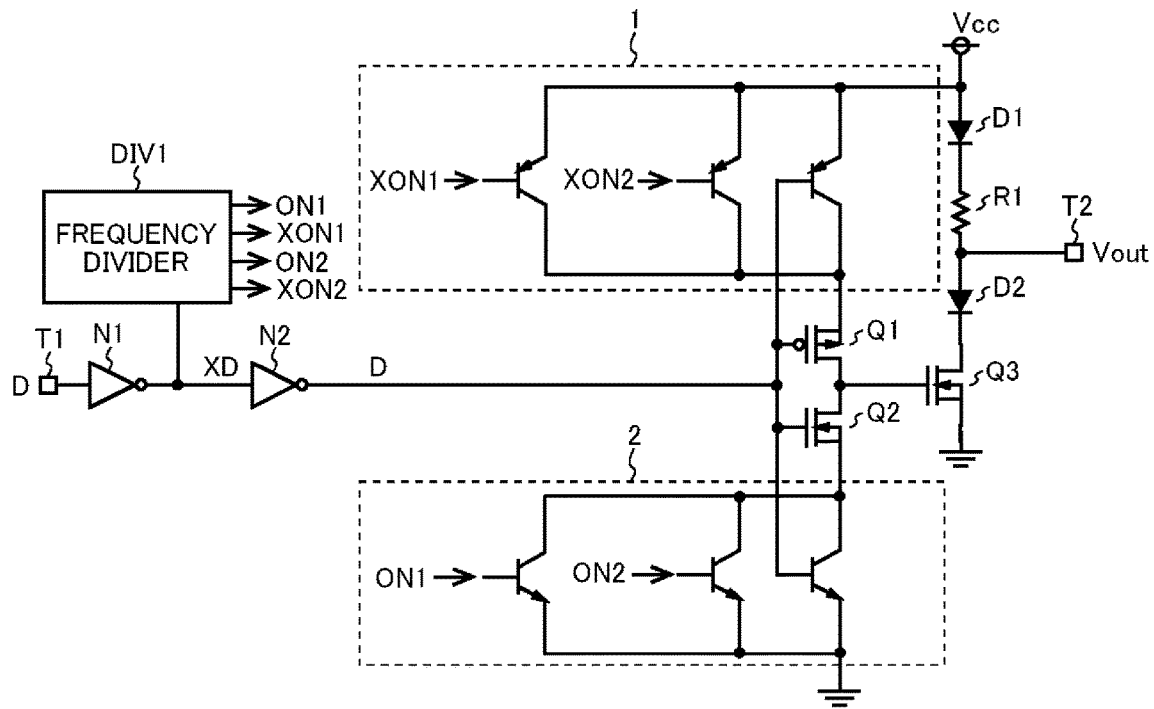
FIG. 7C is a diagram schematically illustrating still another switching control circuit according to the fourth embodiment.

FIG. 7A to FIG. 7C are diagrams schematically illustrating a switching control circuit according to a fourth embodiment. The switching control circuit according to this embodiment is different from the switching control circuit according to the first embodiment in that the constant current source is not used. In the structure illustrated in FIG. 7A, a resistor is used instead of the constant current source CS10, a series circuit of a resistor and a switch, which is turned on when the frequency-divided signal XON1 is at high level and is turned off when the frequency-divided signal XON1 is at low level, is used instead of the constant current source CS11, and a series circuit of a resistor and a switch, which is turned on when the frequency-divided signal XON2 is at high level and is turned off when the frequency-divided signal XON2 is at low level, is used instead of the constant current source CS12. Further, in the structure illustrated in FIG. 7A, a resistor is used instead of the constant current source CS20, a series circuit of a resistor and a switch, which is turned on when the frequency-divided signal ON1 is at high level and is turned off when the frequency-divided signal ON1 is at low level, is used instead of the constant current source CS21, and a series circuit of a resistor and a switch, which is turned on when the frequency-divided signal ON2 is at high level and is turned off when the frequency-divided signal ON2 is at low level, is used instead of the constant current source CS22. In the structure illustrated in FIG. 7B, P-channel MOS field-effect transistors are used instead of the constant current sources CS10 to CS12, N-channel MOS field-effect transistors are used instead of the constant current sources CS20 to CS22. In the structure illustrated in FIG. 7C, PNP bipolar transistors are used instead of the constant current sources CS10 to CS12, and NPN bipolar transistors are used instead of the constant current sources CS20 to CS22.

The switching control circuit according to this embodiment can reduce a peak value of EMI noise generated when the switching element Q3 is driven, in the same manner as the switching control circuit according to the first embodiment. In this way, it is possible to reduce bad influence to surrounding devices by the EMI noise generated when the switching element Q3 is driven. However, in the switching control circuit according to this embodiment, the current sources 1 and 2 are not constituted of the constant current source, and hence drive capacities of the current sources 1 and 2 are apt to fluctuate due to temperature or the like.

In addition, a modification similar to the modification from the switching control circuit according to the first embodiment to the switching control circuit according to the fourth embodiment can be performed also on the switching control circuit according to the second embodiment or the switching control circuit according to the third embodiment.

<Applications>

Figure 8:
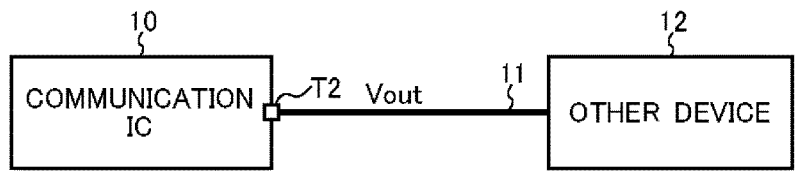
FIG. 8 is a diagram schematically illustrating a connection state between a communication IC and other device.

Applications of the switching control circuit described above are described below. For example, it is preferred to use the entire circuit illustrated in FIG. 1 as an output stage of a communication IC 10 illustrated in FIG. 8. The communication IC 10 illustrated in FIG. 8 functions as a communication device and outputs the output voltage Vout as a pulse signal to other device 12 from the terminal T2 via a bus line 11. If the communication IC 10 is mounted in a vehicle, the bus line 11 is a local interconnect network (LIN) bus line, for example.

Figure 9:
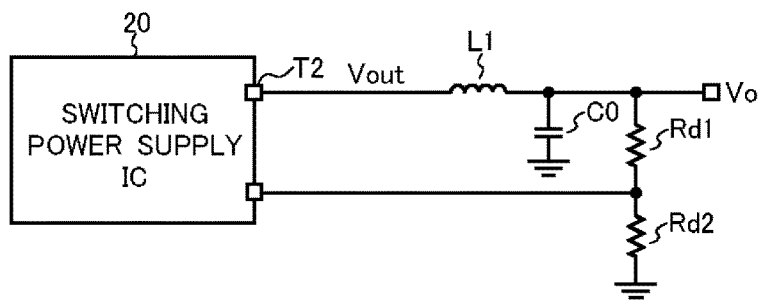
FIG. 9 is a diagram schematically illustrating a switching power supply device.

In addition, it is preferred to use the entire circuit illustrated in FIG. 1, for example, as an output stage of a switching power supply IC 20 illustrated in FIG. 9. The switching power supply IC 20, an inductor L1, an output capacitor CO, and voltage-dividing resistors Rd1 and Rd2 illustrated in FIG. 9 function as a step-down switching power supply device. The inductor L1 and the output capacitor CO smooth the output voltage Vout output from the terminal T2 of the switching power supply IC 20 so as to generate the voltage Vo. The voltage-dividing resistors Rd1 and Rd2 divide the voltage Vo and supply the divided voltage of the voltage Vo to the switching power supply IC 20. The switching power supply IC 20 generates the pulse signal D based on the divided voltage of the voltage Vo.

Figure 10:
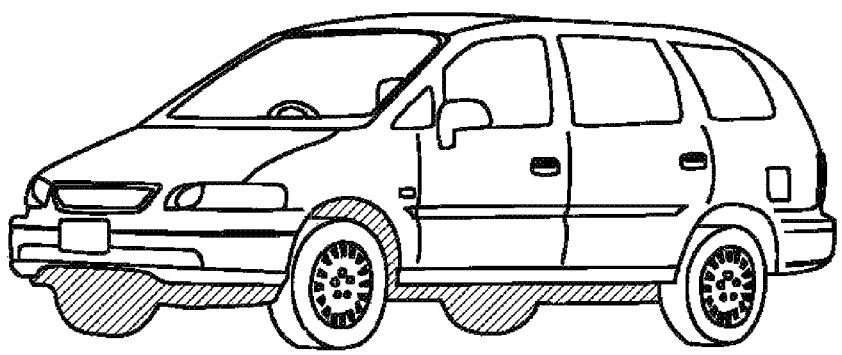
FIG. 10 is a diagram illustrating an external view of a vehicle.

FIG. 10 is an external view illustrating a vehicle X in which at least one of the communication IC 10 and the switching power supply IC 20 described above is mounted.

Figure 11:
FIG. 11 is a diagram illustrating an external view of a mobile device.

FIG. 11 is an external view illustrating an example of an electronic device (mobile device (smart phone) Z) in which at least one of the communication IC 10 and the switching power supply IC 20 described above is mounted. However, the mobile device X is merely an example of the electronic device in which the communication device or the switching power supply device is appropriately mounted, and one of the communication IC 10 and the switching power supply IC 20 described above can be mounted in various types of electronic devices (in particular, electronic devices required to have enforced countermeasures against noise).

<Variations>

The embodiments described above are merely examples in every aspect and should not be interpreted as limitations. The technical scope of the present invention is defined not by the above description of the embodiments but by the claims and should be understood to include all modifications within meanings and scopes equivalent to the claims.

Figure 12:
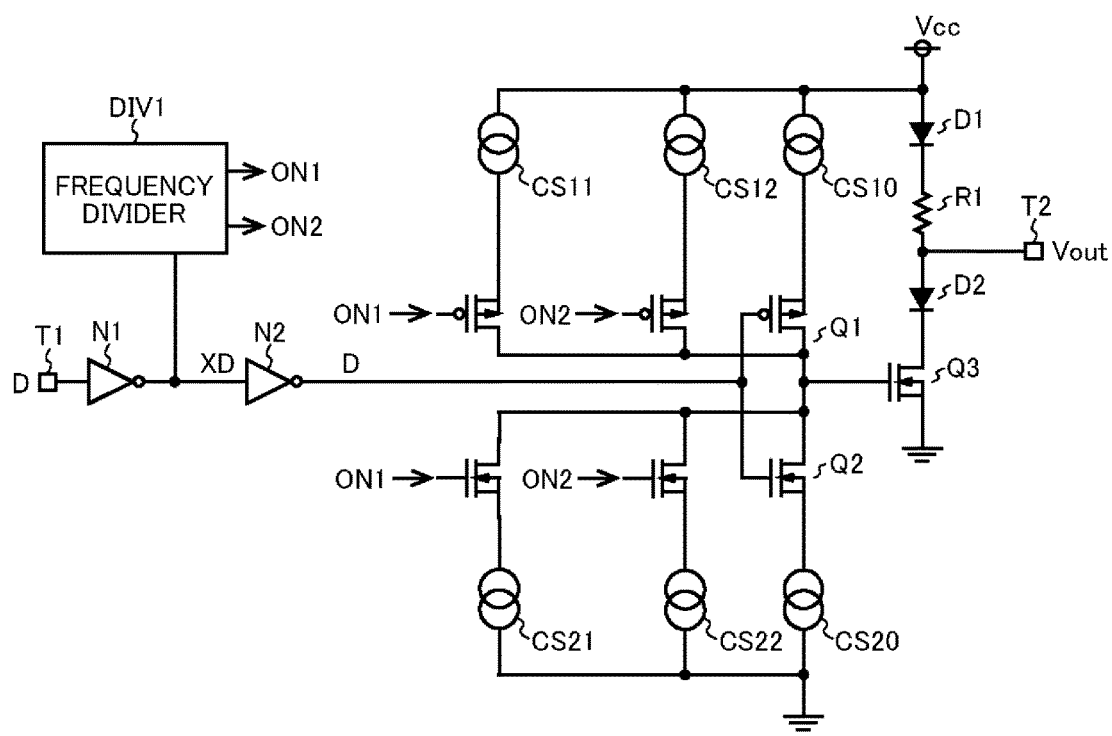
FIG. 12 is a diagram schematically illustrating a variation of the switching control circuit.

For example, in the embodiment described above, for simple control to prevent a through current from flowing, the current source 1, the switch Q1, the switch Q2, and the current source 2 are connected in series. However, it is possible to adopt a structure illustrated in FIG. 12, for example, in which at both edges of each pulse of the output voltage Vout generated corresponding to on/off of the switching element Q3, as a value of the current supplied to the gate of the switching element Q3 at one edge is larger, a value of the current that flows out from the gate of the switching element Q3 at the other edge is smaller. Note that in the structure illustrated in FIG. 12, each constant current source is always enabled. With this structure, control to prevent a through current from flowing becomes complicated, but a peak value of EMI noise generated when the switching element is driven can be reduced, and as to each pulse of the output voltage Vout, it is possible to prevent the sum of the rising slew rate and the falling slew rate of the gate signal supplied to the gate of the switching element Q3 from being fluctuated. Therefore it is possible to prevent on-duty of the output voltage Vout from being fluctuated by influence of the slew rate of the gate signal supplied to the gate of the switching element Q3.

More preferably, at both edges of each pulse of the output voltage Vout generated corresponding to on/off of the switching element Q3, the sum of the value of the current supplied to the gate of the switching element Q3 at one edge and the value of the current that flows out from the gate of the switching element Q3 at the other edge is substantially constant.

<Summary>

The switching control circuit described above includes a first current source, a second current source, a first switch disposed between the first current source and a gate of a switching element, and a second switch disposed between the second current source and the gate of the switching element, in which the first switch and the second switch are complementarily turned on and off according to a pulse signal, and at least one of a value of current supplied to the gate of the switching element from the first current source when the first switch is turned on, and a value of current that flows out from the gate of the switching element to the second current source when the second switch is turned on, is changed periodically (first structure).

In addition, the switching control circuit having the first structure may have a structure, in which at least one of the value of current supplied to the gate of the switching element from the first current source when the first switch is turned on, and the value of current that flows out from the gate of the switching element to the second current source when the second switch is turned on, is changed at each period of the pulse signal (second structure).

In addition, the switching control circuit having the second structure may have a structure, in which both the value of current supplied to the gate of the switching element from the first current source when the first switch is turned on, and the value of current that flows out from the gate of the switching element to the second current source when the second switch is turned on, are changed periodically, and at both edges of each pulse of a signal generated corresponding to on/off of the switching element, as the value of current supplied to the gate of the switching element at one edge is larger, the value of current that flows out from the gate of the switching element at the other edge is smaller (third structure).

In addition, the switching control circuit having the third structure may have a structure, in which at both edges of each pulse of the signal generated corresponding to on/off of the switching element, the sum of the value of current supplied to the gate of the switching element at one edge and the value of current that flows out from the gate of the switching element at the other edge is substantially constant (fourth structure).

In addition, the switching control circuit having one of the first to fourth structures may have a structure, in which a frequency divider arranged to generate a frequency-divided signal of the pulse signal is provided, and at least one of the first current source and the second current source is controlled based on the frequency-divided signal of the pulse signal (fifth structure).

In addition, the switching control circuit having the fifth structure may have a structure, in which the frequency divider generates a ½ frequency-divided signal of the pulse signal and a ¼ frequency-divided signal of the pulse signal (sixth structure).

In addition, the switching control circuit having the fifth or sixth structure may have a structure, in which a delay time of the frequency-divided signal of the pulse signal from the pulse signal is more than or equal to a maximum value of a pulse rising time of the signal generated corresponding to on/off of the switching element, and is more than or equal to a maximum value of a pulse falling time of the signal generated corresponding to on/off of the switching element (seventh structure).

In addition, the switching control circuit having one of the first to seventh structures may have a structure, in which at both edges of each pulse of the signal generated corresponding to on/off of the switching element, the sum of a rising slew rate time of a signal supplied to the gate of the switching element at one edge and a falling slew rate time of a signal supplied to the gate of the switching element at the other edge is substantially constant (eighth structure).

In addition, the switching control circuit having one of the first to eighth structures may have a structure, in which at both edges of each pulse of the signal generated corresponding to on/off of the switching element, the rising slew rate time of the signal supplied to the gate of the switching element at one edge and the falling slew rate time of the signal supplied to the gate of the switching element at the other edge have values different from each other (ninth structure).

In addition, the communication device described above includes the switching control circuit having one of the first to ninth structures and the switching element (tenth structure).

In addition, the switching power supply device described above includes the switching control circuit having one of the first to ninth structures and the switching element (eleventh structure).

In addition, the vehicle described above includes at least one of the communication device having the tenth structure and the switching power supply device having the eleventh structure (twelfth structure).

In addition, the electronic device described above includes at least one of the communication device having the tenth structure and the switching power supply device having the eleventh structure (thirteenth structure).

What is claimed is:

1. A switching control circuit comprising:
   a first current source;
   a second current source;
   a first switch disposed between the first current source and a gate of a switching element; and
   a second switch disposed between the second current source and the gate of the switching element, wherein the first switch and the second switch are complementarily turned on and off according to a pulse signal, and
   at least one of a value of current supplied to the gate of the switching element from the first current source when the first switch is turned on, and a value of current that flows out from the gate of the switching element to the second current source when the second switch is turned on, is changed periodically, wherein at least one of the value of current supplied to the gate of the switching element from the first current source when the first switch is turned on, and the value of current that flows out from the gate of the switching element to the second current source when the second switch is turned on, is changed at each period of the pulse signal, both the value of current supplied to the gate of the switching element from the first current source when the first switch is turned on, and the value of current that flows out from the gate of the switching element to the second current source when the second switch is turned on, are changed periodically, and at both edges of each pulse of the signal generated corresponding to on/off of the switching element, as the value of current supplied to the gate of the switching element at one edge is larger, the value of current that flows out from the gate of the switching element at the other edge is smaller.

2. The switching control circuit according to claim 1, wherein at both edges of each pulse of the signal generated corresponding to on/off of the switching element, a sum of the value of current supplied to the gate of the switching element at one edge and the value of current that flows out from the gate of the switching element at the other edge is substantially constant.

3. A communication device comprising:
the switching control circuit according to claim 1; and
the switching element.

4. A vehicle comprising the communication device according to claim 3.

5. An electronic device comprising the communication device according to claim 3.

6. A switching power supply device comprising:
the switching control circuit according to claim 1; and
the switching element.

7. A vehicle comprising the switching power supply device according to claim 6.

8. An electronic device comprising the switching power supply device according to claim 6.

9. A switching control circuit comprising:
a first current source;
a second current source;
a first switch disposed between the first current source and a gate of a switching element; and
a second switch disposed between the second current source and the gate of the switching element, wherein
the first switch and the second switch are complementarily turned on and off according to a pulse signal, and
at least one of a value of current supplied to the gate of the switching element from the first current source when the first switch is turned on, and a value of current that flows out from the gate of the switching element to the second current source when the second switch is turned on, is changed periodically,
wherein a frequency divider arranged to generate a frequency-divided signal of the pulse signal is provided,
at least one of the first current source and the second current source is controlled based on the frequency-divided signal of the pulse signal,
the frequency divider generates a ½ frequency-divided signal of the pulse signal and a ¼ frequency-divided signal of the pulse signal, and a delay time of the frequency-divided signal of the pulse signal is more than or equal to a maximum value of a pulse rising time of the signal generated corresponding to on/off of the switching element, and is more than or equal to a maximum value of a pulse falling time of the signal generated corresponding to on/off of the switching element.

10. A communication device comprising:
the switching control circuit according to claim 9; and
the switching element.

11. A vehicle comprising the communication device according to claim 10.

12. An electronic device comprising the communication device according to claim 10.

13. A switching power supply device comprising:
the switching control circuit according to claim 9; and
the switching element.

14. A vehicle comprising the switching power supply device according to claim 13.

15. An electronic device comprising the switching power supply device according to claim 13.

16. A switching control circuit comprising:
a first current source;
a second current source;
a first switch disposed between the first current source and a gate of a switching element; and
a second switch disposed between the second current source and the gate of the switching element, wherein
the first switch and the second switch are complementarily turned on and off according to a pulse signal, and
at least one of a value of current supplied to the gate of the switching element from the first current source when the first switch is turned on, and a value of current that flows out from the gate of the switching element to the second current source when the second switch is turned on, is changed periodically,
wherein at both edges of each pulse of the signal generated corresponding to on/off of the switching element, a sum of a rising slew rate time of a signal supplied to the gate of the switching element at one edge and a falling slew rate time of a signal supplied to the gate of the switching element at the other edge is substantially constant.

17. A communication device comprising:
the switching control circuit according to claim 16; and
the switching element.

18. A vehicle comprising the communication device according to claim 17.

19. An electronic device comprising the communication device according to claim 17.

20. A switching power supply device comprising:
the switching control circuit according to claim 16; and
the switching element.

21. A vehicle comprising the switching power supply device according to claim 20.

22. An electronic device comprising the switching power supply device according to claim 20.

23. A switching control circuit comprising:
a first current source;
a second current source;
a first switch disposed between the first current source and a gate of a switching element; and
a second switch disposed between the second current source and the gate of the switching element, wherein
the first switch and the second switch are complementarily turned on and off according to a pulse signal, and at least one of a value of current supplied to the gate of the switching element from the first current source when the first switch is turned on, and a value of current that flows out from the gate of the switching element to the second current source when the second switch is turned on, is changed periodically, wherein at both edges of each pulse of the signal generated corresponding to on/off of the switching element, a rising slew rate time of the signal supplied to the gate of the switching element at one edge and a falling slew rate time of the signal supplied to the gate of the switching element at the other edge have values different from each other.

24. A communication device comprising:
the switching control circuit according to claim 23; and
the switching element.

25. A vehicle comprising the communication device according to claim 24.

26. An electronic device comprising the communication device according to claim 24.

27. A switching power supply device comprising:
the switching control circuit according to claim 23; and
the switching element.

28. A vehicle comprising the switching power supply device according to claim 27.

29. An electronic device comprising the switching power supply device according to claim 27.

* * * * *